SEMICONDUCTIVE CONTACTS

Original Filed May 19, 1961

INVENTORS.
Walter S. Jaeger
James E. Moore, Jr.
BY
Stevens, Davis, Miller & Mosher
ATTORNEYS United States Patent Office 3,523,222

Patented Aug. 4, 1970

3,523,222

SEMICONDUCTIVE CONTACTS

Walter S. Jaeger, New Boston, and James E. Moore, Jr., Dallas, Tex., assignors to Texas Instruments Incorporated, Dallas, Tex., a corporation of Delaware Continuation of application Ser. No. 450,096, Apr. 22, 1965, which is a continuation of application Ser. No. 111,327, May 19, 1961. This application Sept. 15, 1966, Ser. No. 579,788

Int. Cl. H01l 1/14

U.S. Cl. 317—234 7 Claims

ABSTRACT OF THE DISCLOSURE

Disclosed is a semiconductor device having multilayer ohmic contacts to different regions of the device. The multilayer ohmic contact has a layer of palladium engaging the surface of the device with a gold layer overlying the palladium layer, the palladium layer forming a barrier between the device surface and the gold layer.

This is a continuation application of our prior application, Ser. No. 450,096, Apr. 22, 1965, now abandoned. Prior application, Ser. No. 450,096 was a continuation application of our prior application, Ser. No. 111,327, filed May 19, 1961, now abandoned. This invention relates to contacting electrodes to semiconductor devices.

Among the most difficult problems in semiconductor device fabrication is that of contacting the active regions of the semiconductor with reliable, low resistance contacts. In the fabrication of such contacts, the contacting material must bond to the semiconductor to form an integral part thereof, must be inert to insure stable, long term operation and must have a fairly high melting point and low vapor pressure to avoid spreading. The material must also be quite malleable for a subsequent bonding operation, must form a nonrectifying low resistance contact to n or p-type semiconductor material, and must be easy to handle and use.

All of the above conditions are adequately met with gold which has a special advantage as a contact substance for use with semiconductors since for the latter materials it is not a conductivity type affecting impurity. Unfortunately, the depth of the gold alloyed with a semiconductor material is difficult to control even though with a silicon transistor, for example, the depth is controllable during the evaporation of the gold on the emitter and base regions at the eutectic temperature of 366° C. between gold and silicon. But the subsequent heating of the transistor above 366° C. to bond the collector portion thereof to the gold-plated Kovar header often causes the gold previously alloyed with the emitter and base regions to increase its alloy depth sufficiently to short-out the junctions of the transistor, especially a transistor of the mesa type.

The present invention provides a gold contact to an active region of a semiconductor which avoids the danger of uncontrolled alloy depth. This is accomplished by bonding a first conducting material to the semiconductor surface which is chemically stable therewith but which does not alloy deeply therein. The gold is then bonded to the surface of the first conducting material, thereby avoiding physical contact between the gold and the semiconductor. Thus the first conducting material acts as a barrier against deep alloying of gold in the semiconductor devices.

It is therefore an object of this invention to provide a gold contact to the active region of a semiconductor device which precludes the disadvantages of previous gold contacts to semiconductor devices.

A feature of this invention is the use of a first conducting material between the semiconductor surface and the gold, thereby preventing the gold from alloying with the device and shorting-out the active regions of the device.

Other objects, features and advantages of the invention will become apparent from the following detailed description of a preferred embodiment thereof, taken in connection with the appended claims and the accompanying drawing in which:

Figures 1, 2:
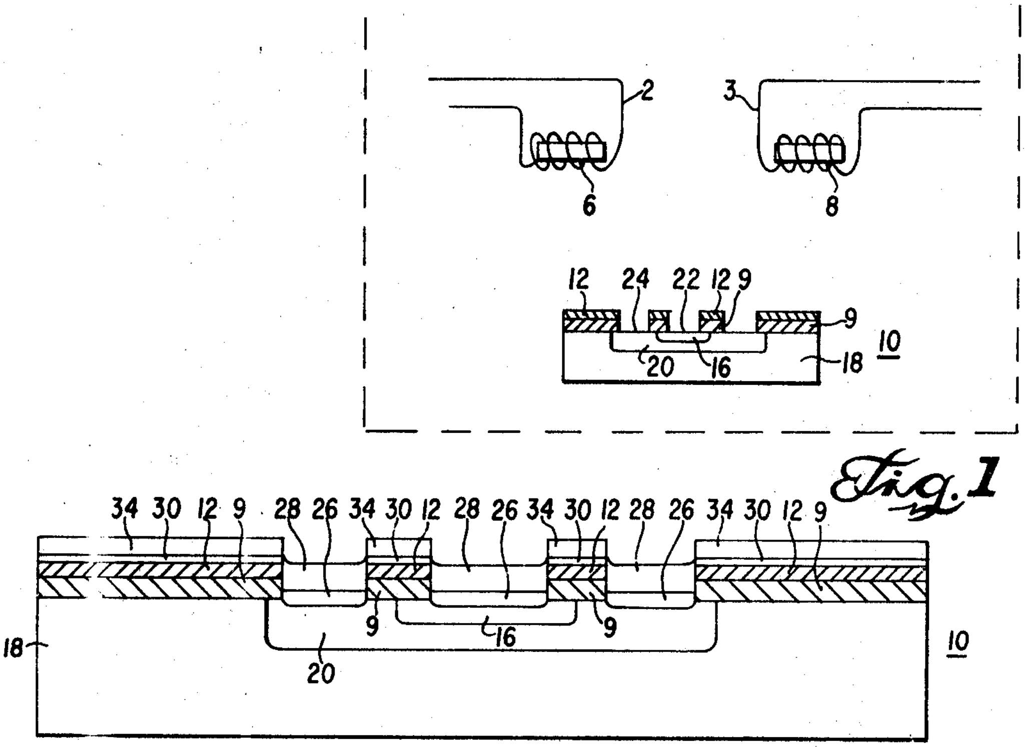
FIG. 1 shows diagrammatically one arrangement for carrying out the method of the invention.
FIG. 2 shows in cross-section an expanded view of the contact formation at the active regions of the semiconductor device during the bonding operation.

Referring now to the figures of the drawing in which like reference characters refer to like parts, FIG. 1 shows a sectional view of a planar type diffused silicon transistor 10 with collector region 18, base region 20 and emitter region 16. During the diffusion of impurities to form the emitter region 16, a silicon dioxide layer 9 is formed on the surface thereof. As shown in FIG. 1, openings 22 and 24 are formed in the silicon dioxide layer 9 by coating the silicon dioxide layer 9 with a photo-resist such as Kodak Metal Etch Resist (product of the Eastman Kodak Company and hereinafter referred to as KMER) and thereafter selectively exposing the coating to light. The exposed KMER is then developed, the unexposed portions being washed away in the areas 22 and 24. (In the instant example, opening 24 is circular and surrounds opening 22.) Hydrofluoric acid is then used to etch away the silicon dioxide not covered by the developed KMER, producing openings 22 and 24 and exposing portions of the emitter region 16 and base region 20, respectively. The developed KMER 12 is left on the surface of the silicon dioxide layer 9 at this stage of the process.

The silicon transistor 10 is placed in an evaporation chamber (not shown) where evaporations can be made to take place in either a vacuum or an inert atmosphere. Within the evaporation chamber are two evaporation coils 2 and 3 for the evaporation of distinct materials. These coils are of any suitable resistance wire, such as tungsten for example, and both are wound to a size that will freely permit the insertion in each of the materials to be vaporized. A spacing of about 3 to 4 inches between transistor 10 and the interior surface of each of the evaporation coils has been found to be effective for carrying out the process of the invention.

To illustrate one embodiment of the invention as a specific example, a charge 6 of approximately 300 mg. of pure palladium is placed in evaporation coil 2, and a charge 8 of approximately 900 mg. of gold is placed in evaporation coil 3. The transistor 10 is spaced a distance of about 4 inches from the evaporation coils 2 and 3. The temperature of the transistor 10 can be either elevated during the evaporation of the palladium and the gold to effect bonding or subsequent to the evaporation of these metals. Good results have been achieved by elevating the temperature of the transistor 10 to 670° C., the eutectic temperature between palladium and silicon, just prior to the evaporation of the metals and maintaining this temperature throughout the evaporation. The evaporation of the two metals 6 and 8 is produced by passing an electrical current through the respective evaporation coils.

To prevent the simultaneous evaporation of the metals, and to evaporate them in the desired sequence, the palladium charge 6 is evaporated first by passing current through coil 2, no current being then passed through coil 3. After the palladium charge 6 is fully evaporated, current is passed through coil 3 and maintained therethrough until the bold charge 8 is fully evaporated. These two evaporations require but a few seconds, during which the entire top surface of transistor 10 becomes covered with a layer of palladium and a layer of gold on top of the layer of palladium. For a 300 mg. charge of palladium and a 900 mg. charge of gold, and the spacing between those charges and the transistor surface 10 being 4 inches, the layer of evaporated palladium on the surface of the transistor is about 2000 angstrom units and that of the gold is about 4000 angstrom units. Because of the elevated temperature of transistor 10, the palladium bonds with the exposed portions of the emitter region 16 and base region 20 where the palladium is evaporated. The alloy depth is very slight, it being difficult to measure, but is indicated in FIG. 2 as a layer 26 deposited on the surface of the emitter region 16 and the base region 20. Palladium is also deposited as a thin layer 30 on the developed KMER layer 12 that was left on the surface of transistor 10. The gold evaporation produces a layer 28 on deposited palladium layer 26 and a layer 34 on palladium layer 30. Because of the elevated temperature of transistor 10, the gold layer 28 contiguous with the deposited palladium layer 26 bonds with the palladium.

It should be stated that in carrying out the above indicated evaporation operation, the transistor 10 is not a single unit but a semiconductor slice from which several hundred diffused transistors are later produced by known methods. The actual number of transistors, their geometry and surface areas in no way affect the thickness of the layer to be evaporated on the transistor surface. This thickness is governed only by the respective masses of the charges 6 and 8 to be evaporated and the distance between the transistor surfaces and evaporative coils.

Figure 3:
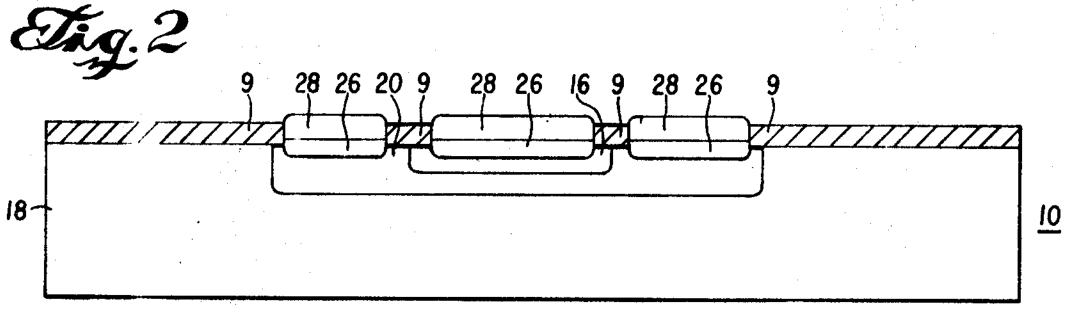
FIG. 3 shows in cross-section an expanded view of the contact formation at the active regions of the semiconductor device after the excess contacting material has been removed therefrom.

The elevated temperature of transistor 10 causes the developed KMER layer 12 to become brittle and crusty. After the transistor is cooled to room temperature, the brittle layer 12 of KMER and layers 30 and 34 of palladium and gold, respectively, are readily washed off the surface of the device using, for example, trichloroethylene, and leaving only the silicon dioxide layer 9 and palladium-gold contacts on the surface thereof, as shown in FIG. 3.

Figure 4:
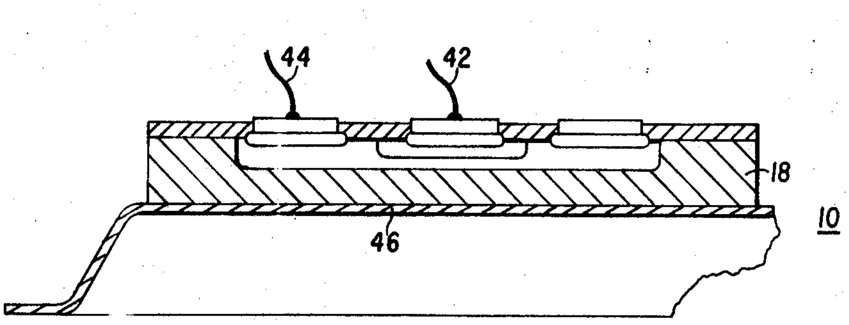
FIG. 4 shows in cross-section a semiconductor device mounted on a transistor header with lead wires attached to the contacts at the active regions of the device.

After the contacts have been made, the transistor is mounted, via the collector region 18, on a gold-plated Kovar transistor header, as shown in FIG. 4, by using a preform of gold therebetween in the presence of heat. Gold wires 42 and 44 are thermally bonded to the gold-palladium contacts on the emitter 16 and base regions 20, respectively, thus completing the fabrication of the device.

The sequential procedure for the evaporation and bonding of the contacts to the silicon surface, as described, may be varied. For example, the palladium and gold can be evaporated onto the device surface in that order and the device subsequently heated to the eutectic temperature for palladium and silicon to effect the bonding therebetween. Good results have been achieved by using this procedure. Moreover, an evaporation process is not necessary to effect good contacts according to this invention. Preforms of palladium and gold for example, may be placed in their appropriate positions on the surface of a semiconductor body and heated to effect the bonding operation.

This invention is not limited in its application to silicon transistor surfaces. Since palladium and gold are compatible with semiconductors in general for contacting purposes, the invention includes its application to other semiconductor materials as well. Moreover, the times, temperatures, quantities specified and contact configurations in the foregoing description may be varied without departing from the spirit of this invention as defined by the appended claims.

What is claimed is:

1. An ohmic contact for a semiconductor device of the type having opposite conductivity regions at one surface of a semiconductor body with a P-N junction intermediate said opposite conductivity regions, said P-N junction extending to said one surface beneath insulating material upon said one surface, comprising:

(a) a first palladium layer in non-rectifying ohmic contact to at least one of said opposite conductivity regions in an opening in said insulating material, and (b) a second layer of gold overlying said first palladium layer, said first palladium layer providing a barrier to the deep alloying of the gold of said second layer with the said semiconductor body.

2. A planar semiconductor device, comprising:

(a) a body of semiconductor material having a collector portion therein and diffused base and emitter regions beneath one major surface of said body, (b) a layer of insulating material upon said one major surface, said layer having a first opening therein over said base region and a second opening therein over said emitter region, the emitter-base junction extending to said one major surface beneath said insulating layer, and (c) multilayer contacts to each of said emitter and base regions, each of said contacts including a barrier palladium layer ohmically engaging the said one major surface of said body within said first and second openings and an overlying gold layer in physical contact with said barrier palladium layer, said barrier palladium layer providing a substantial barrier against the gold of the said overlying gold layer alloying with the semiconductor material of the said body.

3. The device as described in claim 2 including an external gold wire to each of said overlying gold layer.

4. A semiconductor device, comprising:

(a) a body of semiconductor material having at least two regions of opposite conductivity type with a P-N junction intermediate said at least two regions, (b) a multilayer ohmic contact to at least one of said at least two regions, said ohmic contact including a palladium layer ohmically engaging the surface of said body of semiconductor material and an overlying layer comprised of gold bonded to said palladium layer, said palladium layer providing a substantial barrier against the alloying of the gold of the said overlying layer with the semiconductor material of the body.

5. The device as described in claim 4 wherein the said body is of silicon semiconductor material.

6. A contact and lead arrangement for a semiconductor device of the type including a semiconductor body having a region adjacent one face thereof with a junction between such region and other semiconductor material of the body, said junction extending to said one face beneath an insulating coating, said arrangement including a palladium layer ohmically engaging the surface of said region in an opening in said insulating coating, a layer comprised of gold overlying said palladium layer, said palladium layer providing a substantial barrier against the alloying of the gold of the said overlying layer with the semiconductor material of the body, and an external wire to said overlying layer.

7. A contact and lead arrangement for a semiconductor device of the type including a semiconductor body having a region adjacent one face thereof with a junction between such region and other semiconductor material of the body, said junction extending to said one face beneath an insulating coating, said arrangement including a palladium layer ohmically engaging the surface of said region in an opening in said insulating coating, a highly conductive metal layer overlying said palladium layer, said palladium layer providing a substantial barrier against the alloying of the metal of the said overlying layer with the semiconductor material of the body, and an external wire to said overlying layer.

References Cited

UNITED STATES PATENTS

| | | | |
|---|---|---|---|
| 2,973,466 | 2/1961 | Atalla et al. | 317—234.5 |
| 2,981,877 | 4/1961 | Noyce | 317—235.40 |
| 3,006,067 | 10/1961 | Anderson et al. | 317—234.5 |
| 3,007,092 | 10/1961 | Cooper | 317—234.5 |
| 2,651,009 | 9/1953 | Meyer | 148—1.5 |
| 2,745,046 | 5/1956 | Lark-Horovitz et al. | 148—1.5 |
| 3,114,088 | 12/1963 | Abercrombie | 148—33 |
| 3,116,174 | 12/1963 | Grust et al. | 148—1.5 |
| 3,186,084 | 6/1965 | Betteridge | 29—472.9 |
| 3,200,310 | 8/1965 | Carman | 317—234 |

JERRY D. CRAIG, Primary Examiner